US009840411B2

(12) United States Patent
Liu et al.

(10) Patent No.: US 9,840,411 B2
(45) Date of Patent: Dec. 12, 2017

(54) PHOTOELECTRIC CONVERSION APPARATUS AND DEVICE

(71) Applicants: Tsinghua University, Beijing (CN); HON HAI PRECISION INDUSTRY CO., LTD., New Taipei (TW)

(72) Inventors: Chang-Hong Liu, Beijing (CN); Dan Xia, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/621,390

(22) Filed: Feb. 13, 2015

(65) Prior Publication Data

US 2015/0243820 A1 Aug. 27, 2015

(30) Foreign Application Priority Data

Feb. 21, 2014 (CN) .......................... 2014 1 0059692

(51) Int. Cl.

| | |
|---|---|
| ***H01L 31/042*** | (2014.01) |
| ***B82Y 10/00*** | (2011.01) |
| ***H01L 35/08*** | (2006.01) |
| ***H01L 35/18*** | (2006.01) |
| ***H01L 35/32*** | (2006.01) |

(52) U.S. Cl.

CPC .............. *B82Y 10/00* (2013.01); *H01L 35/08* (2013.01); *H01L 35/18* (2013.01); *H01L 35/32* (2013.01)

(58) Field of Classification Search

CPC ......... H01L 31/035227; H01L 31/0525; H01L 31/08; H01L 31/18; H01L 31/32; H01L 31/052; H01L 31/0352; B82Y 10/00

See application file for complete search history.

(56) References Cited

U.S. PATENT DOCUMENTS

| | | | | |
|---|---|---|---|---|
| 6,256,996 | B1 | 7/2001 | Ghoshal | |
| 6,908,572 | B1 * | 6/2005 | Derbyshire ............ | B82Y 10/00 252/500 |
| 9,263,660 | B2 | 2/2016 | Liu et al. | |
| 2006/0118158 | A1 * | 6/2006 | Zhang ..................... | H01L 35/34 136/205 |
| 2009/0223558 | A1 * | 9/2009 | Sun ................ | H01L 31/022425 136/255 |
| 2009/0260667 | A1 * | 10/2009 | Chen ....................... | H01L 35/00 136/201 |
| 2010/0084007 | A1 * | 4/2010 | Jo .......................... | B82Y 10/00 136/252 |

(Continued)

FOREIGN PATENT DOCUMENTS

| | | | | |
|---|---|---|---|---|
| CN | 101814867 A | | 8/2010 | |
| TW | 201032365 | | 9/2010 | |
| WO | WO2012157506 | * | 11/2012 | ............ H01M 14/00 |

*Primary Examiner* — Uyen Tran

(74) *Attorney, Agent, or Firm* — ScienBiziP, P.C.

(57) ABSTRACT

The present disclosure relates to a photoelectric conversion apparatus. The photoelectric conversion apparatus includes a carbon nanotube layer, a first thermoelectric conversion layer, a second thermoelectric conversion layer, a first electrode and a second electrode. The carbon nanotube layer includes a plurality of carbon nanotubes. An areal density of the carbon nanotube layer is in a range from about 0.16 $g/m^2$ to about 0.32 $g/m^2$.

17 Claims, 8 Drawing Sheets

10 II II 131 151 12 15 16 133 14 13 153

(56) References Cited

U.S. PATENT DOCUMENTS

| | | | | |
|---|---|---|---|---|
| 2010/0212711 | A1 | 8/2010 | Liu et al. | |
| 2012/0248386 | A1* | 10/2012 | Heremans | C04B 35/547 252/519.13 |
| 2014/0014152 | A1* | 1/2014 | Hsu | H01L 35/30 136/204 |
| 2014/0113127 | A1* | 4/2014 | Tominaga | H01M 4/583 428/323 |

* cited by examiner

PHOTOELECTRIC CONVERSION APPARATUS AND DEVICE

RELATED APPLICATIONS

This application claims priority to Chinese Patent Application No. 201410059692.7 filed on Feb. 21, 2014 in the China Intellectual Property Office, the contents of which are incorporated by reference herein.

FIELD

The present disclosure relates to photoelectric conversion devices, and particularly, to a photoelectric conversion device based on carbon nanotubes.

BACKGROUND

Electrical energy is essential for human development in today's society. Light energy, especially solar energy, is widely used to generate electricity because the raw material is abundant and environmentally friendly.

Solar cell is one type of device for converting light energy to electricity. A solar cell (also referred to as a photovoltaic cell) may be provided using a semiconductor material such as Si, GaAs, AlGaAs, GaInP, and/or AlInP. When light (such as solar radiation) passes through the semiconductor material of a solar cell, an electrical current and/or voltage is generated. However, an area for capturing solar energy may require an equal area of exposed electronic grade semiconductor material, such as single crystal silicon, which may be relatively expensive to manufacture. As such, the solar cell is expensive which may limit the application of the solar cell.

What is needed, therefore, is a photoelectric conversion apparatus and a device using the same based on carbon nanotubes that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

Figure 1:
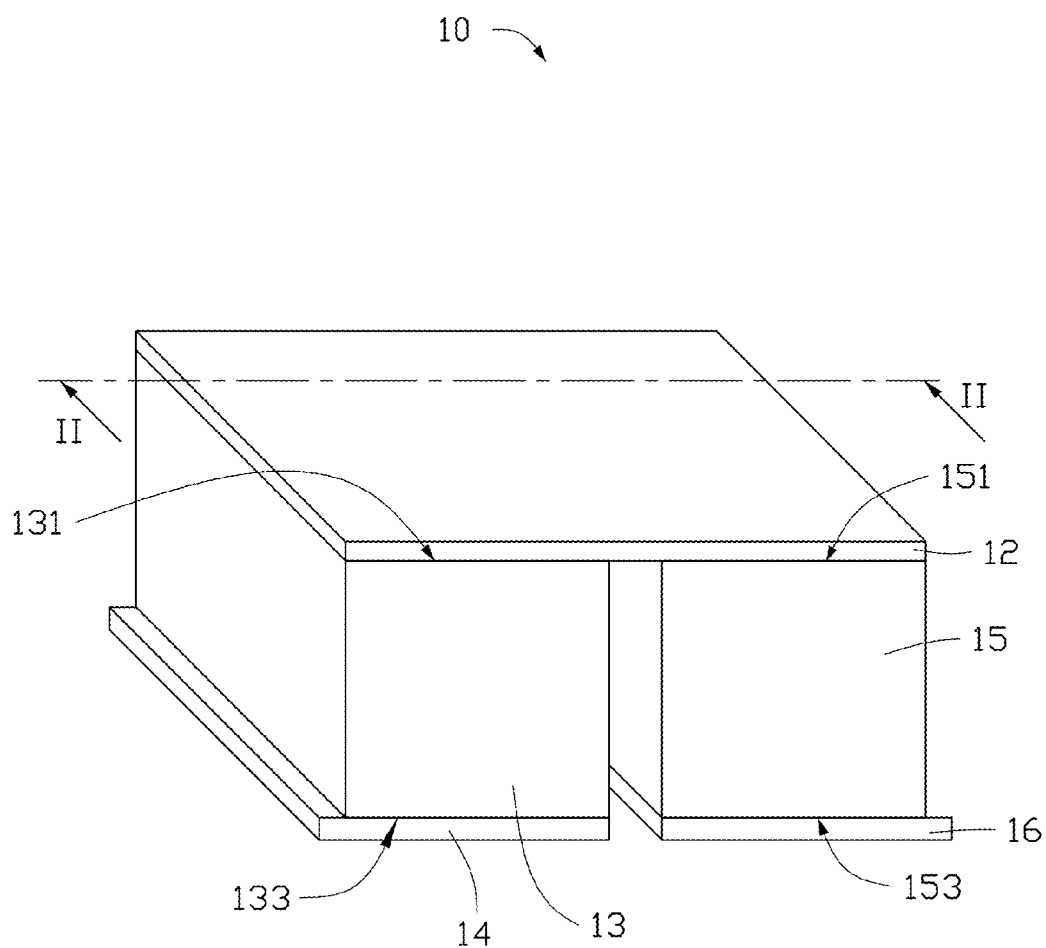
FIG. 1 is a structural schematic view of one embodiment of a photoelectric conversion apparatus.

Corresponding reference characters indicate corresponding parts throughout the several views. The exemplifications set out herein illustrate at least one present embodiment of optical microscopy system and method for using the same, in at least one form, and such exemplifications are not to be construed as limiting the scope of the disclosure in any manner.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present epitaxial structures and methods for making the same.

Figure 2:
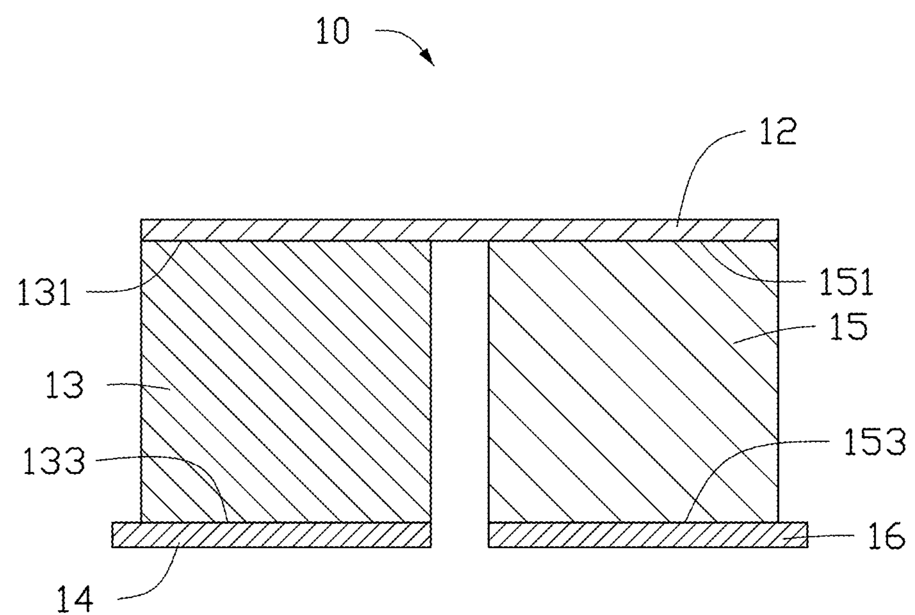
FIG. 2 is a cross-sectional view of the photoelectric conversion apparatus of IFG. 1 along line II-II.

Referring to FIG. 1 and FIG. 2, a first photoelectric conversion apparatus 10 comprises a carbon nanotube layer 12, a first thermoelectric conversion layer 13, a second thermoelectric conversion layer 15, a first electrode 14 and a second electrode 16. The first thermoelectric conversion layer 13 and the second thermoelectric conversion layer 15 are spaced with each other and located on same side of the carbon nanotube layer 12. The first electrode 14 is coated on the first thermoelectric conversion layer 13 and spaced to the carbon nanotube layer 12. The second electrode 16 is coated on the second thermoelectric conversion element 15 and spaced to the carbon nanotube layer 12. The first thermoelectric conversion layer 13 is sandwiched between the carbon nanotube layer 12 and the first electrode 14. The second thermoelectric conversion element 15 is sandwiched between the carbon nanotube layer 12 and the second electrode 16.

The carbon nanotube layer 12 can be planar or have a camber. The carbon nanotube layer 12 can be a free standing structure, that is, the carbon nanotube layer 12 can be supported by itself without a substrate. For example, if at least one point of the carbon nanotube layer 12 is held, the entire carbon nanotube layer 12 can be lifted without being destroyed. The carbon nanotube layer 12 comprises a number of carbon nanotubes disposed uniformly and joined by Van der Waals attractive force therebetween. The carbon nanotubes can be single-walled carbon nanotubes, double-walled carbon nanotubes, multi-walled carbon nanotubes, or combinations thereof. In some embodiments, the carbon nanotubes are single-walled carbon nanotubes. The carbon nanotube layer 12 can be a substantially pure structure of the carbon nanotubes, with few impurities. The carbon nanotubes can be used to form many different structures and provide a large specific surface area. The heat capacity per unit area of the carbon nanotube layer 12 can be less than 2×10−4 J/m2*K. In one embodiment, the heat capacity per unit area of the carbon nanotube layer is less than or equal to 1.7×10−6 J/m2*K.

The carbon nanotubes in the carbon nanotube layer 12 can be orderly or disorderly arranged, to form a ordered carbon nanotube layer or a disordered carbon nanotube layer. The term 'disordered carbon nanotube layer' refers to a structure in which the carbon nanotubes are arranged along different directions, and the aligning directions of the carbon nanotubes are random. The number of the carbon nanotubes arranged along each different direction can be almost the same (e.g. uniformly disordered). The disordered carbon nanotube layer can be isotropic, namely the carbon nanotube layer 12 has properties identical in all directions of the carbon nanotube layer 12. The carbon nanotubes in the disordered carbon nanotube layer can be entangled with each other.

The term 'ordered carbon nanotube layer' refers to a structure in which the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotubes in the carbon nanotube layer 12 can be selected from single-walled, double-walled, and/or multi-walled carbon nanotubes. In one embodiment, the carbon nanotube layer 12 is a pure structure of carbon nanotubes.

The carbon nanotube layer 12 can be a film structure with a thickness ranging from about 100 nanometers (nm) to about 400 nanometers. The carbon nanotube layer 12 can comprise at least one carbon nanotube film.

Figure 3:
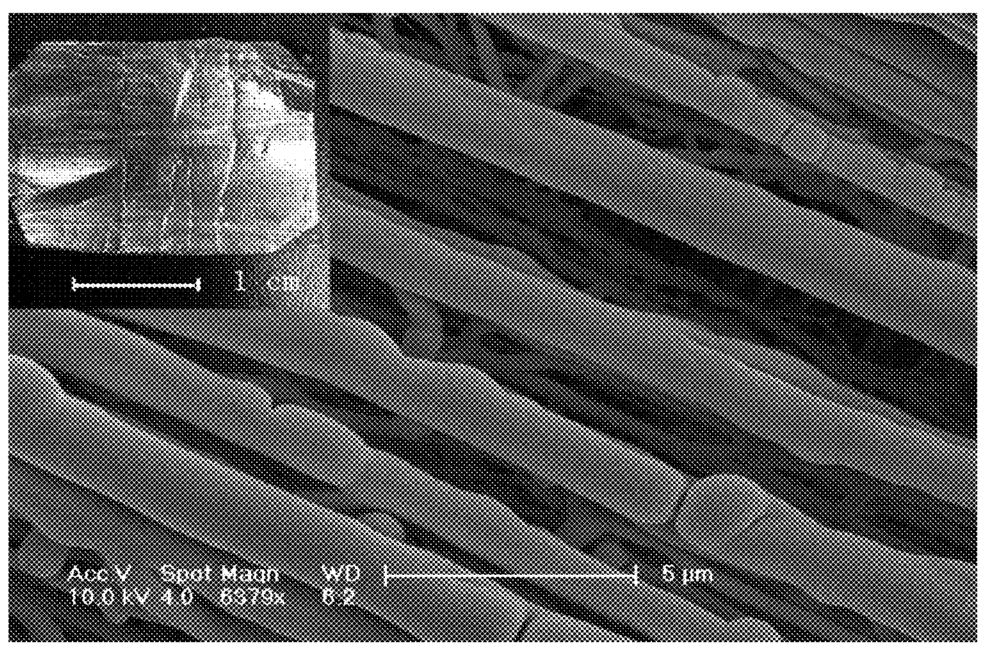
FIG. 3 is a carbon nanotube segment of a carbon nanotube film in one embodiment.

In one embodiment, the carbon nanotube film is a drawn carbon nanotube film. A film can be drawn from a carbon nanotube array, to obtain a drawn carbon nanotube film. The drawn carbon nanotube film comprises a number of successive and oriented carbon nanotubes joined end-to-end by Van der Waals attractive force therebetween. The drawn carbon nanotube film is a free-standing film. Referring to FIG. 3, each drawn carbon nanotube film comprises a number of successively oriented carbon nanotube segments 122 joined end-to-end by Van der Waals attractive force therebetween. Each carbon nanotube segment 122 comprises a number of carbon nanotubes 124 substantially parallel to each other, and joined by Van der Waals attractive force therebetween. Some variations can occur in the drawn carbon nanotube film. The carbon nanotubes in the drawn carbon nanotube film are oriented along a same orientation. The carbon nanotube film can be treated with an organic solvent to increase the mechanical strength and toughness of the carbon nanotube film and reduce the coefficient of friction of the carbon nanotube film. The thickness of the carbon nanotube film can range from about 0.5 nm to about 100 nm.

The carbon nanotube layer 12 can comprise at least two stacked carbon nanotube films. In other embodiments, the carbon nanotube layer 12 can comprise two or more coplanar carbon nanotube films, and can comprise layers of coplanar carbon nanotube films. Additionally, when the carbon nanotubes in the carbon nanotube film are aligned along one preferred orientation (e.g., the drawn carbon nanotube film), an angle can exist between the orientations of carbon nanotubes in adjacent films, whether stacked or adjacent. Adjacent carbon nanotube films can be joined by only the Van der Waals attractive force therebetween. The number of the layers of the carbon nanotube films is not limited. However, the thicker the carbon nanotube layer 12, the specific surface area will decrease. An angle between the aligned directions of the carbon nanotubes in two adjacent carbon nanotube films can range from about 0 degrees to about 90 degrees. If the angle between the aligned directions of the carbon nanotubes in adjacent carbon nanotube films is larger than 0 degrees, the carbon nanotubes in the carbon nanotube layer 12 define a microporous structure. The carbon nanotube layer 12 in an embodiment employing these films will have a number of micropores. Stacking the carbon nanotube films will also add to the structural integrity of the carbon nanotube layer 12.

In other embodiments, the carbon nanotube film can be a flocculated carbon nanotube film. The flocculated carbon nanotube film can comprise a number of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by Van der Waals attractive force to obtain an entangled structure with micropores defined therein. It is noteworthy that the flocculated carbon nanotube film is very porous. Sizes of the micropores can be less than 10 μm. The porous nature of the flocculated carbon nanotube film will increase the specific surface area of the carbon nanotube layer 12. Further, due to the carbon nanotubes in the carbon nanotube layer being entangled with each other, the carbon nanotube layer employing the flocculated carbon nanotube film has excellent durability, and can be fashioned into desired shapes with a low risk to the integrity of the carbon nanotube layer 12. The thickness of the flocculated carbon nanotube film can range from about 0.5 nm to about 100 nm.

In other embodiments, the carbon nanotube film can be a pressed carbon nanotube film. The pressed carbon nanotube film can be a free-standing carbon nanotube film. The carbon nanotubes in the pressed carbon nanotube film are arranged along a same direction or along different directions. The carbon nanotubes in the pressed carbon nanotube film can rest upon each other. Adjacent carbon nanotubes are attracted to each other and are joined by Van der Waals attractive force. An angle between a primary alignment direction of the carbon nanotubes and a surface of the pressed carbon nanotube film is about 0 degrees to approximately 15 degrees. The greater the pressure applied, the smaller the angle obtained. If the carbon nanotubes in the pressed carbon nanotube film are arranged along different directions, the carbon nanotube layer can be isotropic, meaning that the carbon nanotube film has properties identical in all directions substantially parallel to a surface of the carbon nanotube film. The thickness of the pressed carbon nanotube film ranges from about 0.5 nm to about 1 mm.

Because the heat capacity of the carbon nanotube layer 12 is very low, the temperature of the carbon nanotube layer 12 can rise and fall quickly, and has a high response heating speed. Further, because the carbon nanotube has a large specific surface area, the carbon nanotube layer 12 with a number of carbon nanotubes has a larger specific surface area, and the carbon nanotube layer 12 has high absorbing efficiency of light.

The first thermoelectric conversion layer 13 comprises a first surface 131 and a second surface 133 opposite to the first surface 131. The first surface 131 is adhered to the carbon nanotube layer 12. The second surface 133 is coated by the first electrode 14. The second thermoelectric conversion layer 15 comprises a third surface 151 and a fourth surface 153 opposite to the third surface 151. The third surface 151 is adhered to the carbon nanotube layer 12. The fourth surface 153 is coated by the second electrode 16. The first surface 131 and the second surface 151 are adhered to the same side of the carbon nanotube layer 12.

Figure 4:
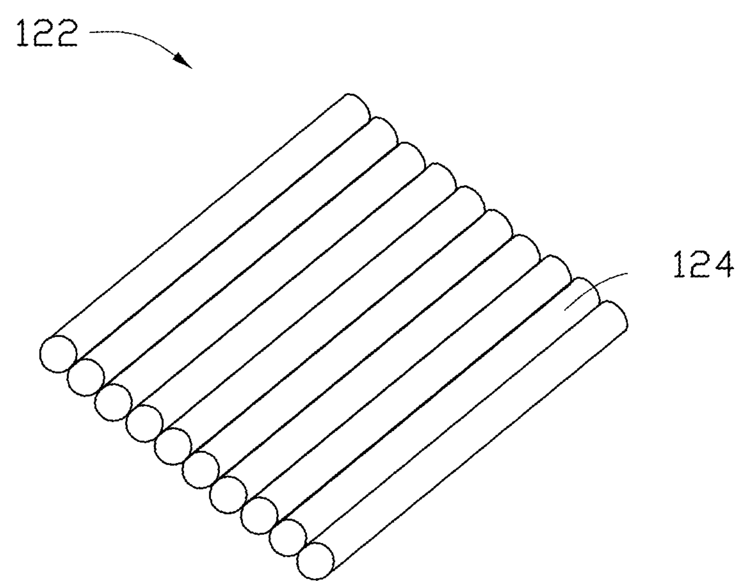
FIG. 4 is Scanning Electron Microscope (SEM) image of a $Bi_{0.5}Sb_{1.5}Te_3$/carbon nanotube layer composite in one embodiment.

The first thermoelectric conversion layer 13 can be a P-type thermoelectric conversion layer. The second thermoelectric conversion layer 15 can be an N-type thermoelectric conversion layer. The first thermoelectric conversion layer 13 can be made of a P-type thermoelectric conversion material, such as P-type $Bi_xSb_{(2-x)}Te_3(0<x<1)$. The second thermoelectric conversion layer 15 can be made of a N-type thermoelectric conversion material, such as N-type $Bi_xSb_{(2-x)}Te_3(0<x<1)$. In one embodiment, the first thermoelectric conversion layer 13 and the second thermoelectric conversion layer 15 are film structures. In one embodiment, the first thermoelectric conversion layer 13 is made of P-type $Bi_{0.5}Sb_{1.5}Te_3$. A thickness of the first thermoelectric conversion layer 13 and the second thermoelectric conversion layer 15 can be in a range from about 0.5 mm to about 3 mm. A distance between the first thermoelectric conversion layer 13 and the second thermoelectric conversion layer 15 can be in a range from about 0.5 mm to about 2 mm. In one embodiment, the thickness of the first thermoelectric conversion layer 13 and the second thermoelectric conversion layer 15 is 1 mm. In one embodiment, the distance between the first thermoelectric conversion layer 13 and the second thermoelectric conversion layer 15 is 2 mm. In one embodiment, the second thermoelectric conversion layer 15 is made of N-type $Bi_{0.5}Sb_{1.5}Te_3$. FIG. 4 is Scanning Electron Microscope (SEM) image of a $Bi_{0.5}Sb_{1.5}Te_3$/carbon nanotube layer composite in one embodiment The first electrode 14 is disposed on the second surface 133. The second electrode 16 is disposed on the fourth surface 153. The first electrode 14 has a same area as the second surface 133, and the second electrode 16 has a same area as the fourth surface 153. A thickness of the first electrode 14 and the second electrode 16 is not limited and can be in a range from about 10 nanometers (nm) to about 500 micrometers (μm). A material of the first electrode 14 and the second electrode 16 can be metal, conductive polymer, or ITO. The metal can be copper, aluminum, or titanium. In one embodiment, the positive electrode layer 12 is a square shaped ITO layer having the thickness of about 200 nm.

The working principle of the first photoelectric conversion apparatus 10 is based on the thermoelectric effect. The thermoelectric effect occurs when a temperature difference exists at two ends of a thermoelectric material, thereby producing an electric potential difference at the two ends. The two ends of the thermoelectric material can be called a higher temperature end and a lower temperature end. If the electric potential difference between the higher temperature end and the lower temperature of the thermoelectric material is positive, the thermoelectric material has a positive thermoelectric coefficient. If the electric potential difference between the higher temperature end and the lower temperature of the thermoelectric material is negative, the thermoelectric material has a negative thermoelectric coefficient. When light energy irradiates on the first photoelectric conversion apparatus 10, the carbon nanotube layer 12 will absorb the light energy. Because of the temperature difference between the first surface 131 and the second surface 135 of the first thermoelectric conversion layer 13, a first electric potential difference is produced between the first surface 131 and the second surface 135. Because of the temperature difference between the third surface 151 and the fourth surface 153 of the second thermoelectric conversion layer 15, a second electric potential difference is produced between the third surface 151 and the fourth surface 153. Because the first photoelectric conversion element 12 is made of a first thermoelectric material having a positive thermoelectric coefficient and the second photoelectric conversion element 14 is made of a second material having a negative thermoelectric coefficient, the first electric potential difference and the second electric potential difference are reverse. Because the first surface 131 and the third surface 151 are electrically connected with each other via the carbon nanotube layer 12, a voltage between the first electrode 14 and the second electrode 16 is a sum of the first electric potential difference and the second electric potential difference. The carbon nanotube layer 12 can strongly absorb light and convert it into heat, has a large thermoelectric coefficient, and has specific heat capacity.

Figure 5:
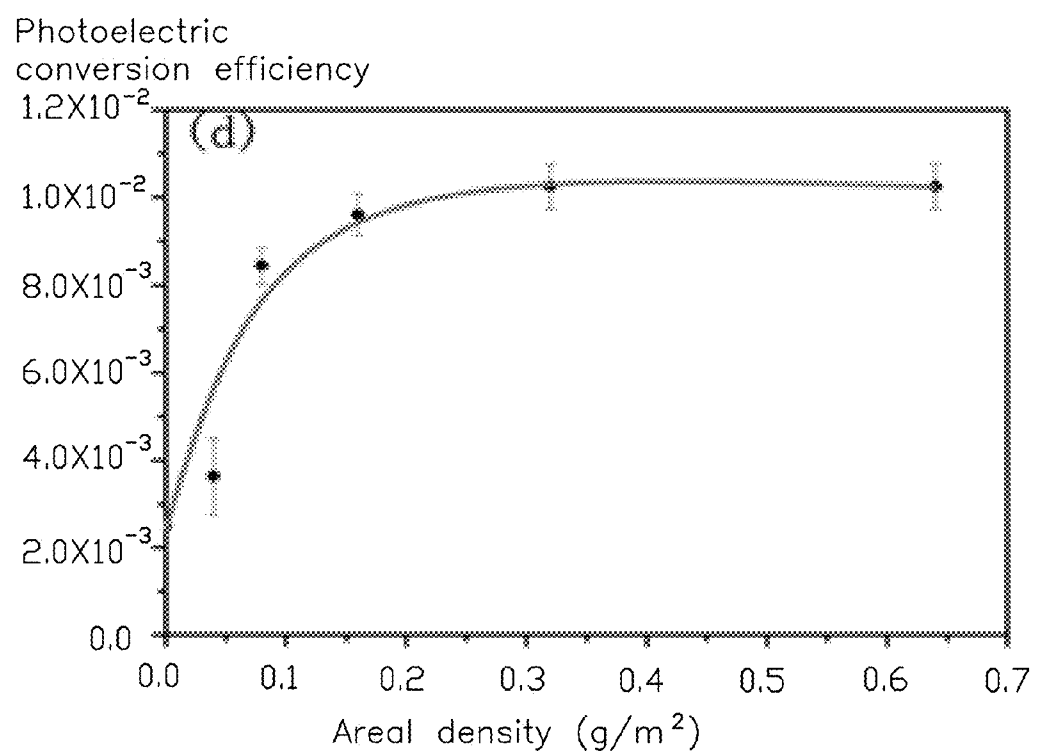
FIG. 5 a relationship chart between areal density and photoelectric conversion efficiency of the carbon nanotube layer in the photoelectric conversion apparatus of FIG. 2.

As shown in FIG. 4 and FIG. 5, the thickness of the carbon nanotube layer 12 has a relationship with photoelectric conversion efficiency of the carbon nanotube layer 12. The areal density of the carbon nanotube layer 12 has a direct proportion to the thickness of the carbon nanotube layer. When the areal density of the carbon nanotube layer 12 is 0.16 g/m2, the thickness of the carbon nanotube layer 12 is 200 nm. When the areal density of the carbon nanotube layer 12 is 0.32 g/m2, the thickness of the carbon nanotube layer 12 is 400 nm. In FIG. 5, when the areal density of the carbon nanotube layer 12 is less than 0.16 g/m2, the photoelectric conversion efficiency is sharply increased with the increasing of the areal density. When the areal density of the carbon nanotube layer 12 is in a range from 0.16 g/m2 to 0.32 g/m2, the photoelectric conversion efficiency is slowly increased with the increasing of the areal density. When the areal density of the carbon nanotube layer 12 is greater than 0.32 g/m2, the photoelectric conversion efficiency is not changed. The thickness of the carbon nanotube layer 12 is in a range from about 110 nm to about 400 nm, corresponding to the areal density in a range from about 0.16 g/m2 to 0.32 g/m2. In one embodiment, the thickness of the carbon nanotube layer 12 is 200 nm.

Figure 6:
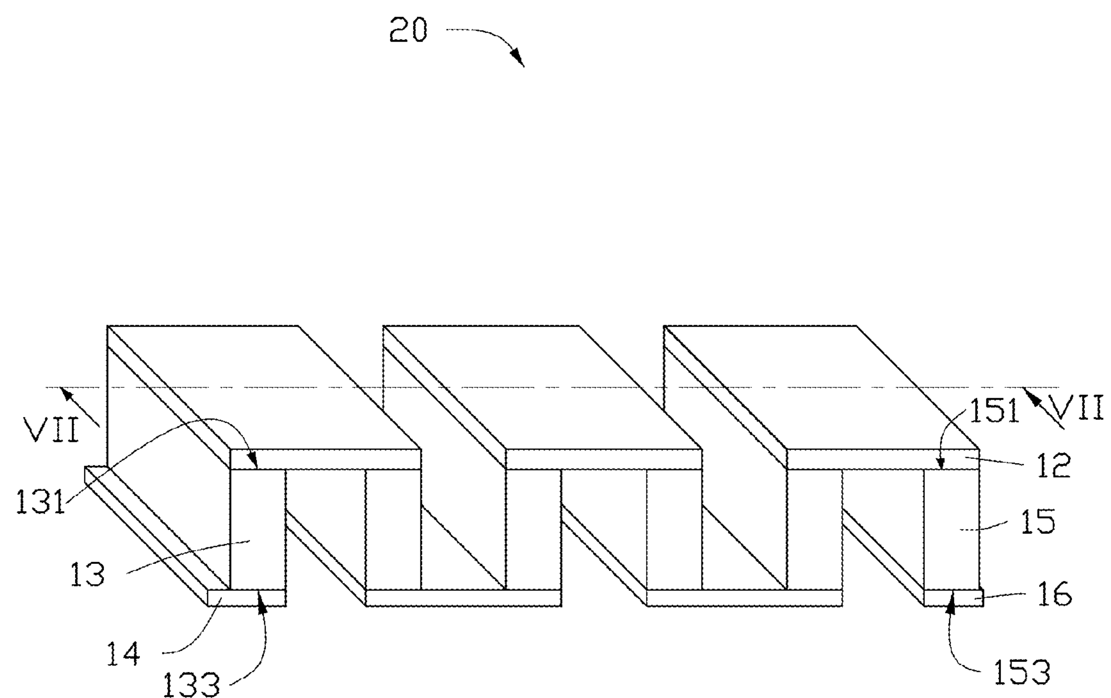
FIG. 6 is a structural schematic view of one embodiment of a photoelectric conversion element
Figure 7:
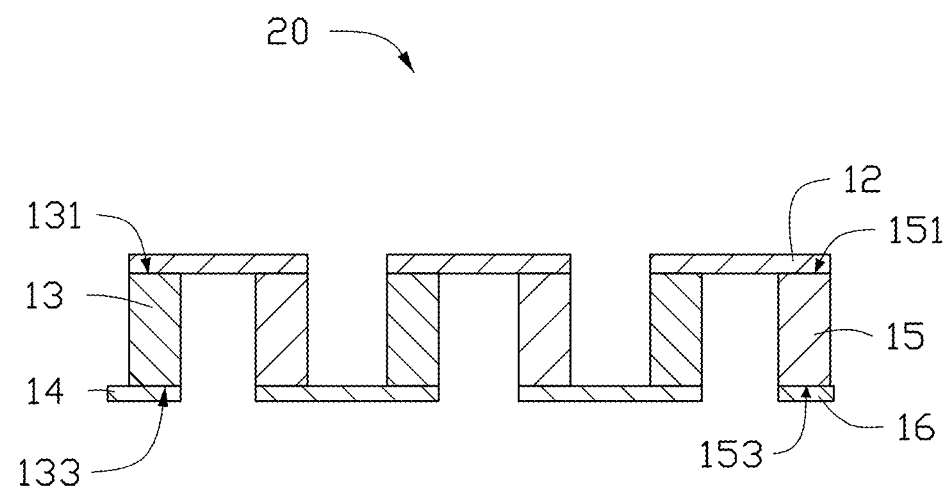
FIG. 7 is a cross-sectional view of the photoelectric conversion element of IFG. 1 along line VII-VII.

Referring to FIG. 6 and FIG. 7, a second photoelectric conversion apparatus 20 is provided according to one embodiment. The second photoelectric conversion apparatus 20 comprises a plurality of the first photoelectric conversion apparatus 10 alternately arranged and spaced apart from each other in a series connection.

Figure 8:
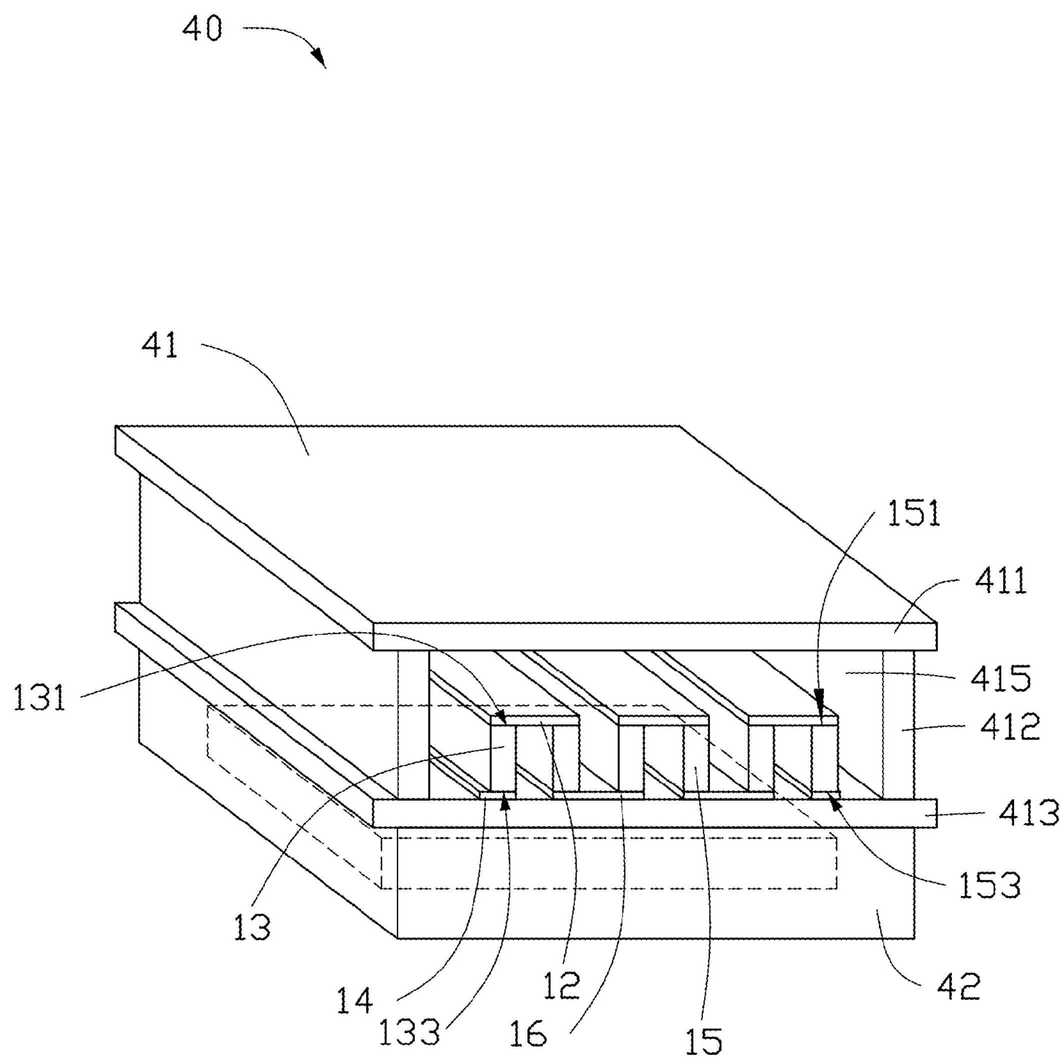
FIG.8 is a structural schematic view of one embodiment of a photoelectric conversion device.

Referring to FIG. 8, a photoelectric conversion device 40 using the photoelectric conversion apparatus 10, 20 is provided. The photoelectric conversion device 40 comprises a heat collector 41 and a cooling device 43.

The heat collector 41 comprises a top substrate 411 a bottom substrate 413, a sidewall 412, the photoelectric conversion apparatus 20. The top substrate 411 faces to and is spaced from the bottom substrate 413. The sidewall 412 is located between the top and bottom substrates 411, 413 and disposed on the edges of the top and bottom substrates 411, 413. A container 415 is defined by the top substrate 411, the bottom substrate 413, and the sidewall 412. The photoelectric conversion apparatus 20 is received in the container 415.

The top substrate 411 may be a transparent plate made of transparent material, such as glass, transparent plastic, silicon, transparent ceramic, transparent resin, or the like. The top substrate 411 has a thickness of about 100 micrometers (μm) to about 5 millimeters (mm). In one embodiment, the top substrate 411 has a thickness of about 3 mm. The top substrate 411 may have a random shape, such as triangular, hexagonal, quadrangular, or the like. In one embodiment, the top substrate 411 is quadrangular and made of glass.

The bottom substrate 413 may be made of glass or metal material that has good thermal conductivity. The metal material may be zinc, aluminum, stainless steel, or the like. The bottom substrate 413 has a thickness of about 100 μm to about 5 mm. In one embodiment, the bottom substrate 413 has a thickness of about 3 mm. The bottom substrate 413 has a random shape, such as triangular, hexagonal, quadrangular, or the like. In one embodiment, the bottom substrate 413 is quadrangular and made of glass.

The sidewall 412 may be made of rigid material, such as glass, ceramic, or the like. The sidewall 412 has a height of about 100 μm to about 500 mm. In this embodiment the sidewall 412 has a height of about 150 μm to about 5 mm.

The container 415 may be a vacuum chamber, or filled with gas that has poor thermal conductivity or material that is transparent and insulated. The gas may be nitrogen, or the like. The transparent material, which is insulated, may be heat resistant plastic, or the like. In one embodiment, the container 415 is one insulated vacuum chamber for preventing air convection therein, thereby improving the absorption rate of the heat collector 41.

The cooling device 42 is disposed on the bottom substrate 413 and outside of the container 415 to increase in the temperature difference between the high temperature area and the low temperature area of the thermoelectric conversion apparatus 20, thereby improving heat-electricity transforming rate of the thermoelectric conversion device 40. The cooling device 42 may be, for example, a water-cooled device.

The heat-electricity rate of the thermoelectric conversion device 40 is improved because the thermoelectric conversion apparatus 20 comprises the carbon nanotube layer with a thickness in a range from about 110 nm to about 400 nm.

Depending on the embodiment, certain steps of the methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A photoelectric conversion apparatus consisting of:

a carbon nanotube layer comprising a plurality of carbon nanotubes, wherein the carbon nanotube layer has an areal density in a range from about 0.16 g/m2 to about 0.32 g/m2, and the carbon nanotube layer converts light into heat; wherein the carbon nanotube layer comprises a plurality of carbon nanotube films stacked with each other, each of the plurality of carbon nanotube films comprises a plurality of carbon nanotubes oriented along a same direction, and an angle between the aligned directions of the carbon nanotubes in two adjacent carbon nanotube films is 90 degrees;

a first thermoelectric conversion layer located on a surface of the carbon nanotube layer; and a second thermoelectric conversion layer located on the surface of the carbon nanotube layer, wherein the first thermoelectric conversion layer is spaced to the second thermoelectric conversion layer;

a first electrode coated on the first thermoelectric conversion layer, wherein the first thermoelectric conversion layer is sandwiched between the carbon nanotube layer and the first electrode; and a second electrode coated on the second thermoelectric conversion layer, wherein the second thermoelectric conversion layer is sandwiched between the carbon nanotube layer and the second electrode.

2. The photoelectric conversion apparatus as claimed in claim 1, wherein the first thermoelectric conversion layer comprises a first surface and a second surface opposite to the first surface, the first surface is adhered to the carbon nanotube layer, the second surface is coated by the first electrode.

3. The photoelectric conversion apparatus as claimed in claim 2, wherein the second thermoelectric conversion layer comprises a third surface and a fourth surface opposite to the third surface, the third surface is adhered to the carbon nanotube layer, the fourth surface is coated by the second electrode.

4. The conversion apparatus as claimed in claim 1, wherein the first thermoelectric conversion layer is a P-type thermoelectric conversion layer, and the second thermoelectric conversion layer can be an N-type thermoelectric conversion layer.

5. The photoelectric conversion apparatus as claimed in claim 4, wherein the first thermoelectric conversion layer is a P-type $Bi_xSb_{(2-x)}Te_3(0<x<1)$, and the second thermoelectric conversion layer is N-type $Bi_xSb_{(2-x)}Te_3(0<x<1)$.

6. The photoelectric conversion apparatus as claimed in claim 5, wherein the first thermoelectric conversion layer is a P-type $Bi_{0.5}Sb_{1.5}Te_3$, and the second thermoelectric conversion layer is N-type $Bi_{0.5}Sb_{1.5}Te_3$.

7. A photoelectric conversion apparatus comprising:

a carbon nanotube layer comprising a plurality of carbon nanotubes, wherein a thickness of the carbon nanotube layer is in arrange from about 110 nm to about 400 nm, the carbon nanotube layer has a light absorbing surface, and the light absorbing surface is exposed and used to directly receive light and convert the light into heat; wherein the carbon nanotube layer comprises a plurality of carbon nanotube films stacked with each other, each of the plurality of carbon nanotube films comprises a plurality of carbon nanotubes oriented along a same direction, and an angle between the aligned directions of the carbon nanotubes in two adjacent carbon nanotube films is 90 degrees;

a first thermoelectric conversion layer located on a surface of the carbon nanotube layer; and a second thermoelectric conversion layer located on the surface of the carbon nanotube layer, wherein the first thermoelectric conversion layer is spaced to the second thermoelectric conversion layer;

a first electrode coated on the first thermoelectric conversion layer, wherein the first thermoelectric conversion layer is sandwiched between the carbon nanotube layer and the first electrode; and a second electrode coated on the second thermoelectric conversion :layer, wherein the second thermoelectric conversion layer is sandwiched between the carbon nanotube layer and the second electrode.

8. The photoelectric conversion apparatus as claimed in claim 7, wherein the first thermoelectric conversion layer comprises a first surface and a second surface opposite to the first surface, the first surface is adhered to the carbon nanotube layer, the second surface is coated by the first electrode.

9. The photoelectric conversion apparatus as claimed in claim 8, wherein the second thermoelectric conversion layer comprises a third surface and a fourth surface opposite to the third surface, the third surface is adhered to the carbon nanotube layer, the fourth surface is coated by the second electrode.

10. The photoelectric conversion apparatus as claimed in claim 7, wherein the first thermoelectric conversion layer is a P-type thermoelectric conversion layer, and the second thermoelectric conversion layer can be an N-type thermoelectric conversion layer.

11. The photoelectric conversion apparatus as claimed in claim 10, wherein the first thermoelectric conversion layer is a P-type $Bi_xSb_{(2-x)}Te_3(0<x<1)$, and the second thermoelectric conversion layer is N-type $Bi_xSb_{(2-x)}Te_3(0<x<1)$.

12. The photoelectric conversion apparatus as claimed in claim 11, wherein the first thermoelectric conversion layer is a P-type $Bi_{0.5}Sb_{1.5}Te_3$, and the second thermoelectric conversion layer is N-type $Bi_{0.5}Sb_{1.5}Te_3$.

13. A photoelectric conversion device comprising:

a heat collector defining a chamber and comprising a top substrate, wherein the top substrate is transparent;

a photoelectric conversion apparatus received in the chamber and consisting of:

a carbon nanotube layer comprising a plurality of carbon nanotubes, wherein the carbon nanotube layer has an areal density m a range from about 0.16 $g/m^2$ to about 0.32 $g/m^2$, and the carbon nanotube converts light into heat; wherein the carbon nanotube layer comprises a plurality of carbon nanotube films stacked with each other, each of the plurality of carbon nanotube films comprises a plurality of carbon nanotubes oriented along a same direction, and an angle between the aligned directions of the carbon nanotubes in two adjacent carbon nanotube films is 90 degrees;

a first thermoelectric conversion layer located on a surface of the carbon nanotube layer, and a second thermoelectric conversion layer located on the surface of the carbon nanotube layer, wherein the first thermoelectric conversion layer is spaced to the second thermoelectric conversion layer;

a first electrode coated on the first thermoelectric conversion laver, wherein the first thermoelectric conversion layer is sandwiched between the carbon nanotube layer and the first electrode; and a second electrode coated on the second thermoelectric conversion layer, wherein the second thermoelectric conversion layer is sandwiched between the carbon nanotube layer and the second electrode;

a cooling device disposed on outside of the chamber.

14. The photoelectric conversion device as claimed in claim 13, wherein the chamber is an insulated vacuum chamber.

15. The photoelectric conversion device as claimed in claim 13, wherein the chamber is filled with nitrogen.

16. The photoelectric conversion apparatus as claimed in claim 13, wherein the photoelectric conversion device comprises a plurality of the photoelectric conversion apparatus alternately arranged and spaced apart from each other in a series connection.

17. The photoelectric conversion apparatus as claimed in claim 1, wherein a thickness of the carbon nanotube layer is about 400 nm, the carbon nanotube layer has an areal density being about 0.32 $g/m^2$, and a photoelectric conversion efficiency of the photoelectric conversion apparatus is about $1.0\times10^{-2}$.

* * * * *